(12) United States Patent
Naitou et al.

(10) Patent No.: US 11,567,444 B2
(45) Date of Patent: Jan. 31, 2023

(54) DEVELOPING TREATMENT APPARATUS AND DEVELOPING TREATMENT METHOD

(71) Applicant: Tokyo Electron Limited, Tokyo (JP)

(72) Inventors: Ryouichirou Naitou, Koshi (JP); Hidenori Tosu, Koshi (JP); Takahiro Yamaguchi, Koshi (JP); Seiichi Kure, Hsin-chu (TW)

(73) Assignee: Tokyo Electron Limited, Tokyo (JP)

( * ) Notice: Subject to any disclaimer, the term of this patent is extended or adjusted under 35 U.S.C. 154(b) by 64 days.

(21) Appl. No.: 17/258,937

(22) PCT Filed: Jul. 8, 2019

(86) PCT No.: PCT/JP2019/026981
§ 371 (c)(1),
(2) Date: Jan. 8, 2021

(87) PCT Pub. No.: WO2020/017376
PCT Pub. Date: Jan. 23, 2020

(65) Prior Publication Data
US 2021/0124303 A1 Apr. 29, 2021

(30) Foreign Application Priority Data

Jul. 18, 2018 (JP) .............................. JP2018-135035

(51) Int. Cl.
*B08B 3/00* (2006.01)
*G03G 21/16* (2006.01)
*H01L 21/027* (2006.01)

(52) U.S. Cl.
CPC ..... *G03G 21/1676* (2013.01); *G03G 21/1666* (2013.01); *H01L 21/027* (2013.01)

(58) Field of Classification Search
CPC ........................................................ B08B 3/02
USPC ........................................ 134/95.3, 153, 902
See application file for complete search history.

(56) References Cited

U.S. PATENT DOCUMENTS 6,062,240 A * 5/2000 Sada ...................... B05C 11/08
134/902

FOREIGN PATENT DOCUMENTS

| JP | S56-110940 A | | 9/1981 |
|----|--------------|---|--------|
| JP | 11305233 | * | 11/1999 |
| JP | 2000-021726 A | | 1/2000 |
| JP | 2007-088262 A | | 4/2007 |
| JP | 2007-317463 A | | 12/2007 |

(Continued)

OTHER PUBLICATIONS

International Search Report of the International Searching Authority dated Sep. 17, 2019 issued in corresponding international application No. PCT/JP2019/026981 (and English translation).

*Primary Examiner* — Hoan H Tran
(74) *Attorney, Agent, or Firm* — Posz Law Group, PLC

(57) ABSTRACT

A developing treatment apparatus for performing a developing treatment on a treatment object substrate. The developing treatment apparatus includes: a rotating and holding part that holds and rotates the treatment object substrate; a discharger that discharges a predetermined solution relating to the developing treatment to the treatment object substrate held on the rotating and holding part; and a destaticizer that supplies ions ionized by an X-ray to the predetermined solution discharged to the treatment object substrate held on the rotating and holding part, to destaticize the predetermined solution.

9 Claims, 11 Drawing Sheets

(56) References Cited

FOREIGN PATENT DOCUMENTS

| JP | 2017-069552 A | 4/2017 |
| JP | 2018-041928 A | 3/2018 |

* cited by examiner

DEVELOPING TREATMENT APPARATUS AND DEVELOPING TREATMENT METHOD

This application is a U.S. national stage application of International Application No. PCT/JP2019/026981 filed on Jul. 8, 2019, based upon and claims the benefit of priority of the prior Japanese Patent Application No. 2018-135035 filed on Jul. 18, 2018, the entire contents of which are incorporated herein by reference.

TECHNICAL FIELD

This disclosure relates to a developing treatment apparatus and a developing treatment method.

BACKGROUND ART

Patent Document 1 discloses a developing solution supply apparatus which supplies butyl acetate as a developing solution via a solution supply path formed of an insulating member to a developing treatment apparatus which performed a developing treatment on a substrate. In the developing solution supply apparatus, an electrostatically charged state of the developing solution is observed in order to prevent the occurrence of leakage of the developing solution because of dielectric breakdown of the solution supply path due to many electric charges occurring in the solution supply path caused by the friction between the developing solution and the solution supply path in the case where the volume resistivity of butyl acetate or the like is high.

PRIOR ART DOCUMENT

[Patent Document]
Patent Document 1: Japanese Patent Application Publication No. 2018-41928

DISCLOSURE OF THE INVENTION

Problems to be Solved by the Invention

A technique according to this disclosure prevents the occurrence of many defects near the center of a treatment object substrate after a developing treatment.

Means for Solving the Problems

An aspect of this disclosure is a developing treatment apparatus for performing a developing treatment on a treatment object substrate, the developing treatment apparatus including: a rotating and holding part configured to hold and rotate the treatment object substrate; a discharger configured to discharge a predetermined solution relating to the developing treatment to the treatment object substrate held on the rotating and holding part; and a destaticizer configured to supply ions ionized by an X-ray to the predetermined solution discharged to the treatment object substrate held on the rotating and holding part, to destaticize the predetermined solution.

Effect of the Invention

According to this disclosure, it is possible to prevent the occurrence of many defects near the center of a treatment object substrate after a developing treatment.

EMBODIMENTS FOR CARRYING OUT THE INVENTION

Figure 1:
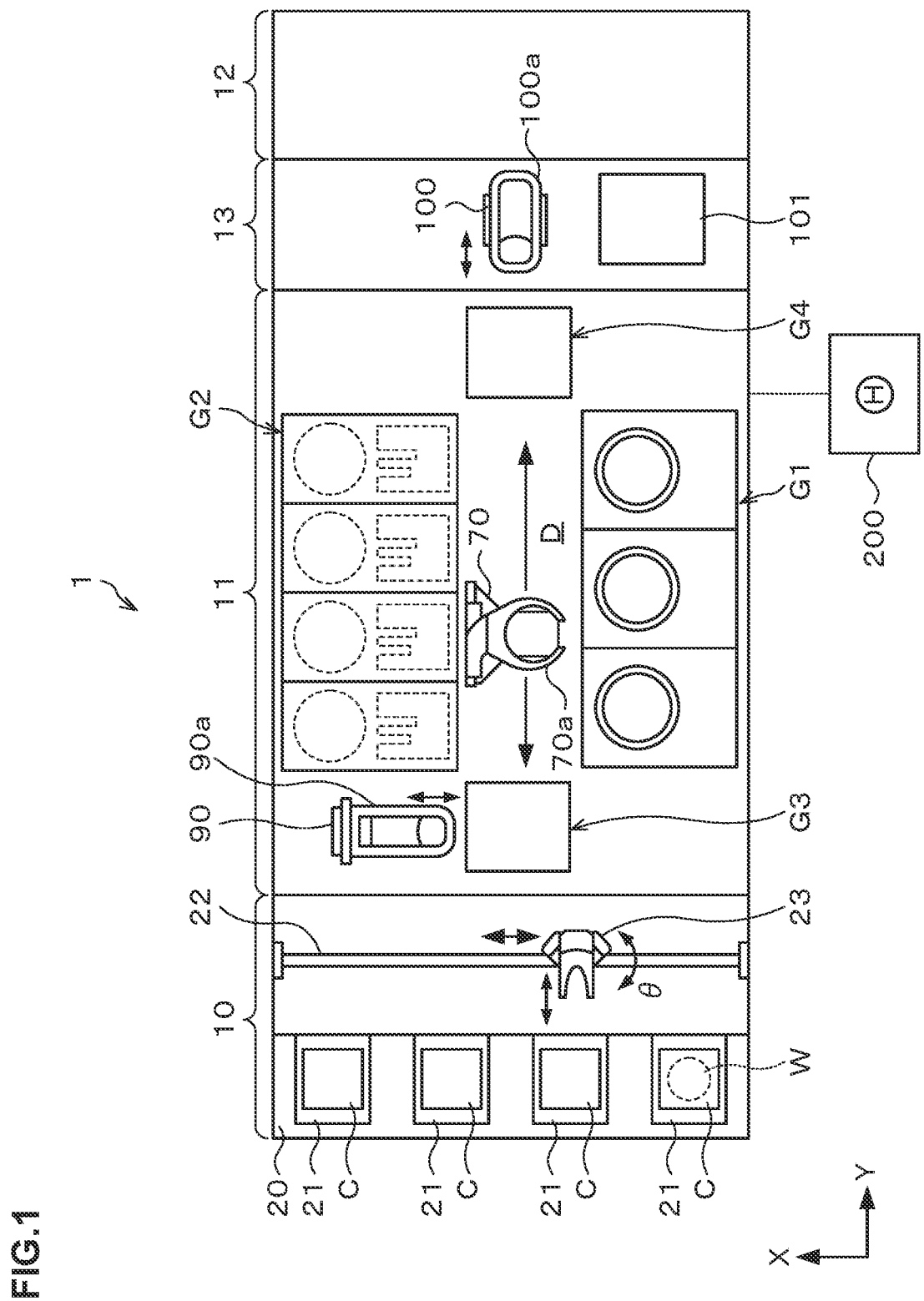
FIG. 1 is a plan view schematically illustrating the outline of a configuration of a substrate treatment system according to an embodiment.

At a photolithography step in a manufacturing process of a semiconductor device or the like, a series of treatments is performed to form a predetermined resist pattern on a semiconductor wafer (hereinafter, referred to as a "wafer") as a treatment object substrate. The above series of treatments includes, for example, a resist coating treatment of applying a resist solution onto the wafer to form a resist film, exposure processing of exposing the resist film, a heat treatment of accelerating a chemical reaction in the exposed resist film, a developing treatment of developing the heat-treated resist film, and so on.

The above developing treatment is generally performed in a developing treatment apparatus and, in the developing treatment apparatus, for example, a developing solution is discharged from a developing solution discharge nozzle to the wafer held on a spin chuck, whereby a solution film of the developing solution is formed on the wafer surface to develop the resist film on the wafer. In Patent Document 1, butyl acetate is used as the developing solution.

According to the confirmation by the present inventors, in the case of using butyl acetate as the developing solution, a center mode may occur in which many defects occur near the center of the wafer after the developing treatment. Further, also in the case of a developing treatment other than the developing treatment using butyl acetate, the aforementioned center mode may occur.

Hereinafter, a developing treatment apparatus and a developing treatment method according to embodiments for preventing the occurrence of the center mode, namely, for preventing the occurrence of many defects near the center of a treatment object substrate after a developing treatment will be explained referring to the drawings. Note that the same codes are given to components having substantially the same functional configurations in the description and the drawings to omit duplicated explanation.

First Embodiment

Figure 2:
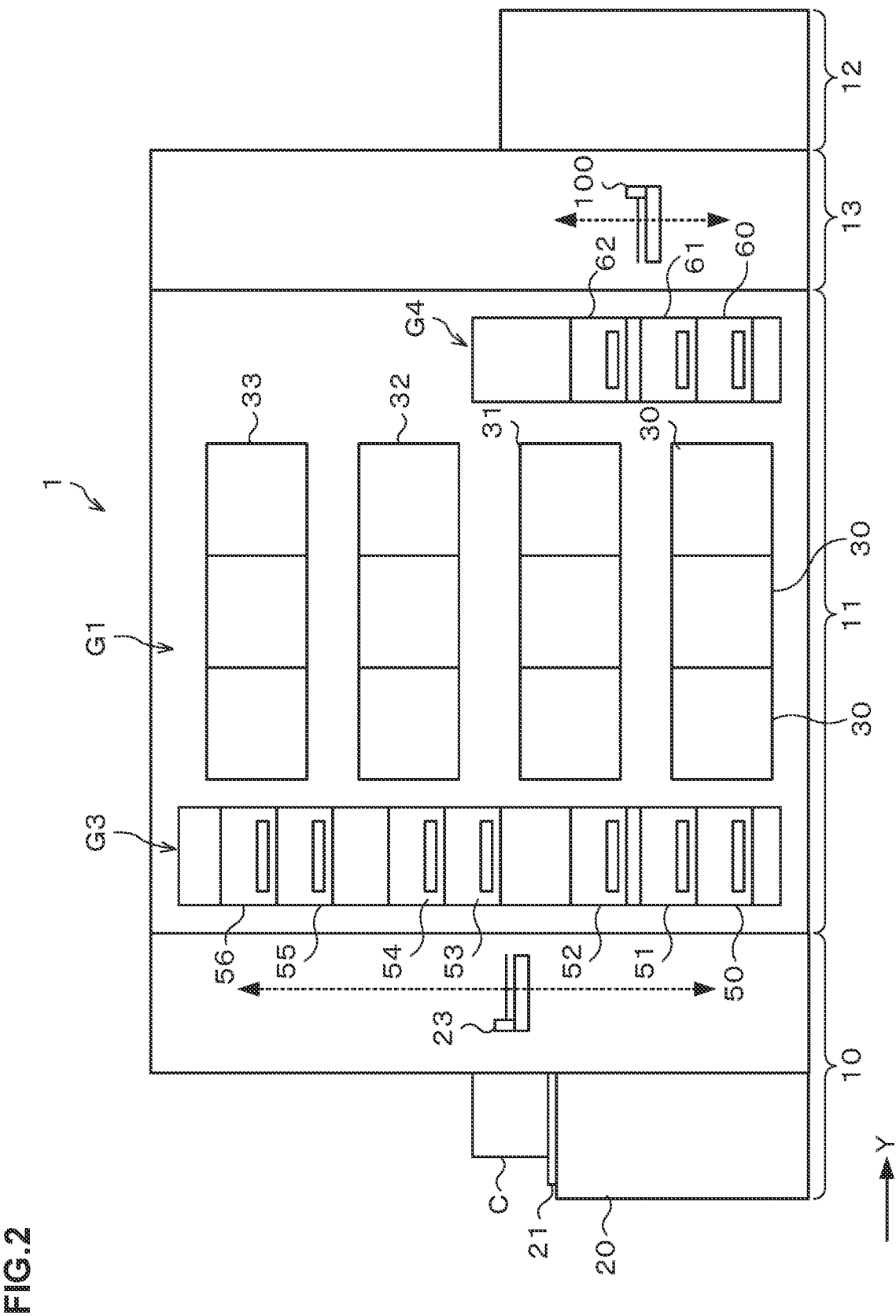
FIG. 2 is a side view illustrating the outline of an internal configuration of the substrate treatment system according to the embodiment.
Figure 3:
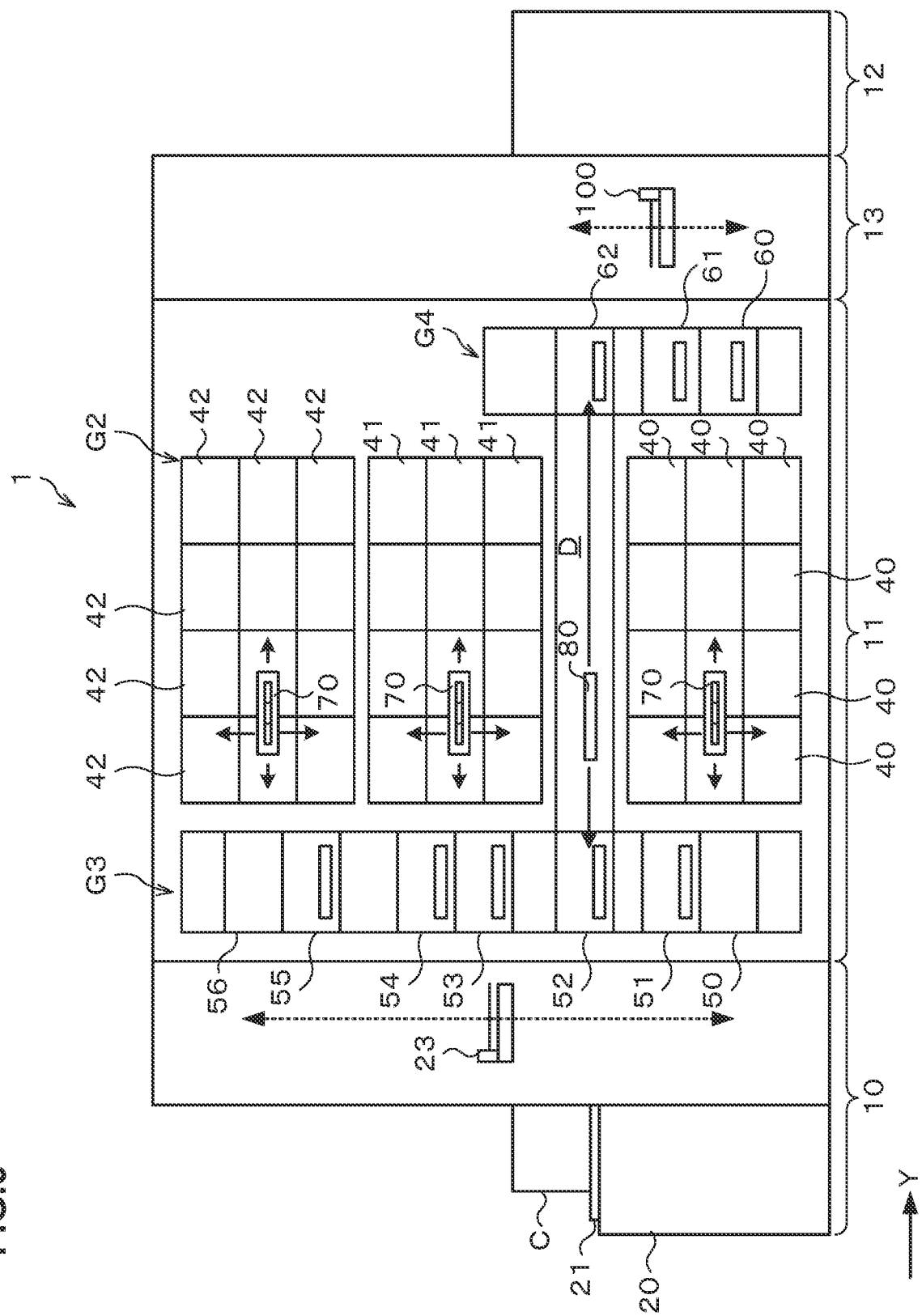
FIG. 3 is a side view illustrating the outline of the internal configuration of the substrate treatment system according to the embodiment.

FIG. 1 is a plan view illustrating the outline of a configuration of a substrate treatment system 1 including a developing treatment apparatus according to this embodiment. FIG. 2 and FIG. 3 are a front view and a rear view schematically illustrating the outline of an internal configuration of the substrate treatment system 1, respectively. Note that in this embodiment, a case where the substrate treatment system 1 is a coating and developing treatment system which performs coating and developing treatments on the wafer W will be explained as an example.

As illustrated in FIG. 1, the substrate treatment system 1 has a cassette station 10 into/out of which a cassette C housing a plurality of wafers W is transferred, and a treatment station 11 including a plurality of various treatment apparatuses which perform predetermined treatments on the wafer W. The substrate treatment system 1 has a configuration in which the cassette station 10, the treatment station 11, and an interface station 13 which delivers the wafer W to/from an exposure apparatus 12 adjacent to the treatment station 11, are integrally connected.

In the cassette station 10, a cassette stage 20 is provided. The cassette stage 20 is provided with a plurality of cassette stage plates 21 on which the cassettes C are mounted when the cassettes C are transferred in/out from/to the outside of the substrate treatment system 1.

In the cassette station 10, a wafer transfer apparatus 23 is provided which is movable on a transfer path 22 extending in an X-direction. The wafer transfer apparatus 23 is movable also in an up-down direction and around a vertical axis (in a θ-direction), and can transfer the wafer W between the cassette C on each of the cassette stage plates 21 and a delivery apparatus in a later-explained third block G3 in the treatment station 11.

In the treatment station 11, a plurality of, for example, four blocks G1, G2, G3, G4 each including various apparatuses are provided. For example, the first block G1 is provided on the front side (X-direction negative direction side in FIG. 1) in the treatment station 11, and the second block G2 is provided on the rear side (X-direction positive direction side in FIG. 1) in the treatment station 11. Further, the third block G3 is provided on the cassette station 10 side (Y-direction negative direction side in FIG. 1) in the treatment station 11, and the fourth block G4 is provided on the interface station 13 side (Y-direction positive direction side in FIG. 1) in the treatment station 11.

In the first block G1, as illustrated in FIG. 2, a plurality of solution treatment apparatuses, for example, developing treatment apparatuses 30, lower anti-reflection film forming apparatuses 31, resist coating apparatuses 32, and upper anti-reflection film forming apparatuses 33 are arranged in this order from the bottom. The developing treatment apparatus 30 is to perform a developing treatment on the wafer W, the lower anti-reflection film forming apparatus 31 is to form an anti-reflection film (hereinafter, referred to as a "lower anti-reflection film") at a lower layer of the resist film of the wafer W, the resist coating apparatus 32 applies a resist solution to the wafer W to form a resist film, and the upper anti-reflection film forming apparatus 33 is to form an anti-reflection film (hereinafter, referred to as an "upper anti-reflection film") at an upper layer of the resist film of the wafer W.

For example, the developing treatment apparatus 30, the lower anti-reflection film forming apparatus 31, the resist coating apparatus 32, and the upper anti-reflection film forming apparatus 33 are arranged three each side by side in the horizontal direction. Note that the numbers and the arrangement of the developing treatment apparatuses 30, the lower anti-reflection film forming apparatuses 31, the resist coating apparatuses 32, and the upper anti-reflection film forming apparatuses 33 can be arbitrarily selected.

In the developing treatment apparatus 30, the lower anti-reflection film forming apparatus 31, the resist coating apparatus 32, and the upper anti-reflection film forming apparatus 33, for example, spin coating is performed. In the spin coating, a treatment solution is discharged, for example, from a discharge nozzle onto the wafer W, and the wafer W is rotated to diffuse the coating solution over the surface of the wafer W. Note that the configuration of the developing treatment apparatus 30 being an object of this disclosure will be explained later.

In the second block G2, as illustrated in FIG. 3, thermal treatment apparatuses 40 each of which performs thermal treatments such as heating and cooling on the wafer W, adhesion apparatuses 41 each for which performs a hydrophobic treatment of enhancing adhesion between the resist solution and the wafer W, and edge exposure apparatuses 42 each of which exposes the outer peripheral portion of the wafer W are provided. The thermal treatment apparatuses 40, the adhesion apparatuses 41, and the edge exposure apparatuses 42 are provided side by side in the up-down direction and in the horizontal direction, and the numbers and the arrangement of them can be arbitrarily selected.

For example, in the third block G3, a plurality of delivery apparatuses 50, 51, 52, 53, 54, 55, 56 are provided in order from the bottom. Further, in the fourth block G4, a plurality of delivery apparatuses 60, 61, 62 are provided in order from the bottom.

In a region surrounded by the first block G1 to the fourth block G4 as illustrated in FIG. 1, a wafer transfer region D is formed. In the wafer transfer region D, a wafer transfer apparatus 70 is arranged.

The wafer transfer apparatuses 70 has a transfer arm 70a movable, for example, in the Y-direction, the X-direction, the θ-direction, and the up-down direction. The wafer transfer apparatus 70 can move in the wafer transfer region D to transfer the wafer W to a predetermined unit in the first block G1, the second block G2, the third block G3, and the fourth block G4 located therearound. A plurality of the wafer transfer apparatuses 70 are arranged one above the other, for example, as illustrated in FIG. 3, and can transfer the wafer W to, for example, predetermined units at the same height in the blocks G1 to G4.

Further, in the wafer transfer region D, a shuttle transfer apparatus 80 is provided which linearly transfers the wafer W between the third block G3 and the fourth block G4.

The shuttle transfer apparatus 80 can linearly move, for example, in the Y-direction in FIG. 3. The shuttle transfer apparatus 80 can move in the Y-direction while supporting the wafer W and transfer the wafer W between the delivery apparatus 52 in the third block G3 and the delivery apparatus 62 in the fourth block G4.

As illustrated in FIG. 1, a wafer transfer apparatus 90 is provided adjacent to the X-direction positive direction side of the third block G3. The wafer transfer apparatus 90 has a transfer arm 90a movable, for example, in the X-direction, the θ-direction, and the up-down direction. The wafer transfer apparatus 90 can move up and down while supporting the wafer W and transfer the wafer W to each of the delivery apparatuses in the third block G3.

In the interface station 13, a wafer transfer apparatus 100 and a delivery apparatus 101 are provided. The wafer transfer apparatus 100 has a transfer arm 100a movable, for example, in the Y-direction, the θ-direction, and the up-down direction. The wafer transfer apparatus 100 can transfer the wafer W to/from each of the delivery apparatuses in the fourth block G4, the delivery apparatus 101, and the exposure apparatus 12, for example, while supporting the wafer W by the transfer arm 100a.

The above substrate treatment system 1 is provided with a controller 200 as illustrated in FIG. 1. The controller 200 is composed of, for example, a computer including a CPU, a memory and so on, and includes a program storage (not illustrated). The program storage stores programs for controlling the operations of a drive system of the above-explained various treatment apparatuses, transfer apparatuses and so on, and also a later-explained operation of the developing treatment apparatus. The above programs may be the ones which are recorded in a computer-readable storage medium H and installed from the storage medium H into the control unit 200.

Next, a wafer treatment performed using the substrate treatment system 1 configured as above will be explained.

First, the cassette C housing a plurality of wafers W is transferred into the cassette station 10 of the substrate treatment system 1 and placed on the cassette stage plate 21. Then, the wafers W in the cassette C are successively taken out by the wafer transfer apparatus 23 and transferred to the delivery apparatus 53 in the third block G3 in the treatment station 11.

The wafer W transferred to the delivery apparatus 53 is transferred by the wafer transfer apparatus 70 to the thermal treatment apparatus 40 in the second block G2 and subjected to a temperature regulation treatment. Subsequently, the wafer W is transferred by the wafer transfer apparatus 70, for example, to the lower anti-reflection film forming apparatus 31 in the first block G1, in which a lower anti-reflection film is formed on the wafer W. The wafer W is thereafter transferred to the thermal treatment apparatus 40 in the second block G2 and subjected to a heat treatment, and then returned to the delivery apparatus 53 in the third block G3.

The wafer W returned to the delivery apparatus 53 is transferred by the wafer transfer apparatus 90 to the delivery apparatus 54 in the same third block G3. Subsequently, the wafer W is transferred by the wafer transfer apparatus 70 to the adhesion apparatus 41 in the second block G2 and subjected to a hydrophobic treatment.

The wafer W subjected to the hydrophobic treatment is transferred by the wafer transfer apparatus 70 to the resist coating apparatus 32, in which a resist film is formed on the wafer W. Thereafter, the wafer W is transferred by the wafer transfer apparatus 70 to the thermal treatment apparatus 40 and subjected to a pre-baking treatment, and transferred to the delivery apparatus 55 in the third block G3.

The wafer W transferred to the delivery apparatus 55 is transferred by the wafer transfer apparatus 70 to the upper anti-reflection film forming apparatus 33, in which an upper anti-reflection film is formed on the wafer W. The wafer W is thereafter transferred by the wafer transfer apparatus 70 to the thermal treatment apparatus 40, and heated and temperature-regulated. After the temperature regulation, the wafer W is transferred to the edge exposure apparatus 42 and subjected to edge exposure processing.

The wafer W subjected to the edge exposure processing is transferred by the wafer transfer apparatus 70 to the delivery apparatus 56 in the third block G3.

The wafer W transferred to the delivery apparatus 56 is transferred by the wafer transfer apparatus 90 to the delivery apparatus 52, and transferred by the shuttle transfer apparatus 80 to the delivery apparatus 62 in the fourth block G4. The wafer W transferred to the delivery apparatus 62 is transferred by the wafer transfer apparatus 100 in the interface station 13 to the exposure apparatus 12 and subjected to exposure processing in a predetermined pattern.

The wafer W subjected to exposure processing is transferred by the wafer transfer apparatus 100 to the delivery apparatus 60 in the fourth block G4. Thereafter, the wafer W is transferred by the wafer transfer apparatus 70 to the thermal treatment apparatus 40 and subjected to a post-exposure baking treatment.

The wafer W subjected to the post-exposure baking treatment is transferred by the wafer transfer apparatus 70 to the developing treatment apparatus 30 and developed. After the completion of the developing treatment, the wafer W is transferred by the wafer transfer apparatus 70 to the thermal treatment apparatus 40 and subjected to a post-baking treatment.

Thereafter, the wafer W is transferred by the wafer transfer apparatus 70 to the delivery apparatus 50 in the third block G3, and transferred by the wafer transfer apparatus 23 in the cassette station 10 to the cassette C on the predetermined cassette stage plate 21. Thus, a serial photolithography step is completed.

Next, the configuration of the developing treatment apparatus 30 according to this embodiment will be explained referring to FIG. 4 and FIG. 5.

Figure 4:
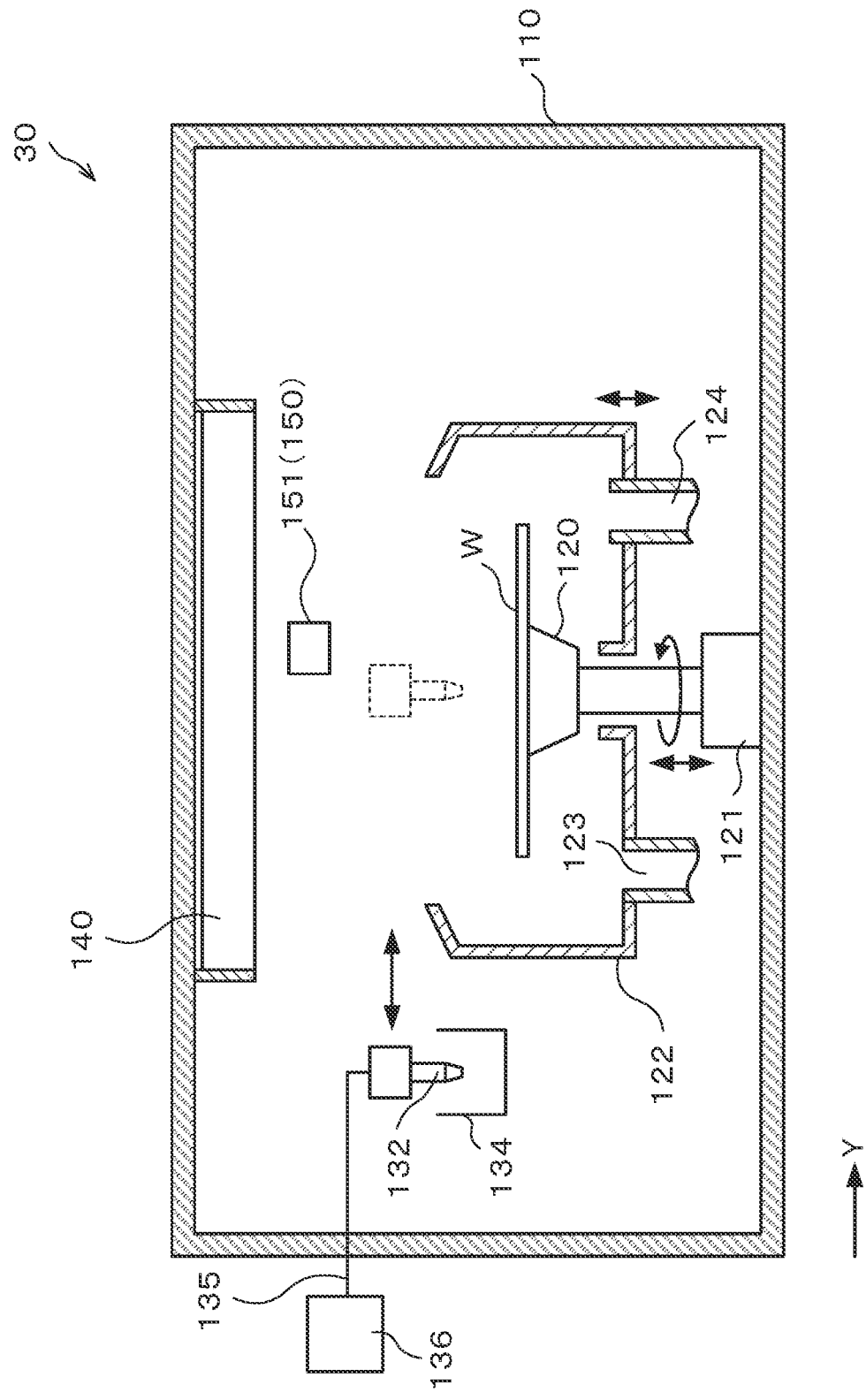
FIG. 4 is a transverse sectional view illustrating the outline of a configuration of a developing treatment apparatus according to a first embodiment.

As illustrated in FIG. 4, the developing treatment apparatus 30 has a housing 110 whose inside can be hermetically closed. As illustrated in FIG. 5, a side surface of the housing 110 is formed with a transfer-in/out port 111 for the wafer W, and the transfer-in/out port 111 is provided with an opening and closing shutter 112. The housing 110 including the opening and closing shutter 112 is formed of a material not transmitting a soft X-ray radiated from a later-explained X-ray radiator. Further, the opening and closing shutter 112 is controlled not to open the transfer-in/out port 111 at the time when the soft X-ray is emitted from the X-ray radiator.

As illustrated in FIG. 4, at a central portion in the housing 110, a spin chuck 120 is provided as a rotating and holding part which holds and rotates the wafer W. The spin chuck 120 has a horizontal upper surface, and the upper surface is provided with, for example, a suction port (not illustrated) for sucking the wafer W. By suction through the suction port, the wafer W can be suction-held on the spin chuck 120.

The spin chuck 120 is configured to be rotatable at a desired speed by a chuck drive 121 such as a motor. Further, the chuck drive 121 is provided with a not-illustrated raising and lowering drive mechanism such as a cylinder so that the spin chuck 120 is configured to freely rise and lower by the raising and lowering drive mechanism.

Around the spin chuck 120, to a bottom surface of a cup 122 which receives and collects liquid such as a developing solution, a cleaning solution or the like splashing or dropping from the wafer W, a drain pipe 123 which drains the collected liquid and an exhaust pipe 124 which exhausts the atmosphere inside the cup 122 are connected.

Figure 5:
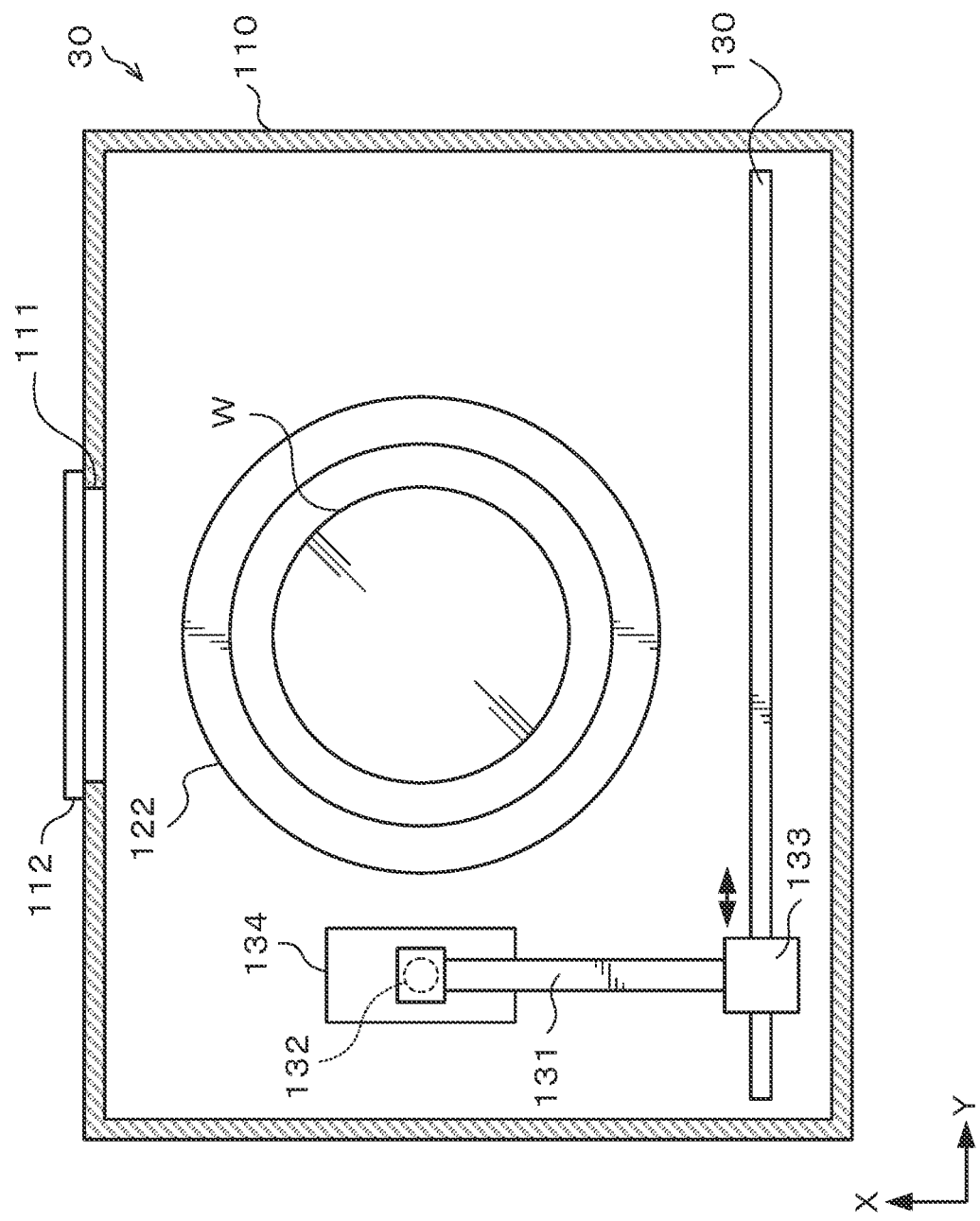
FIG. 5 is a longitudinal sectional view illustrating the outline of the configuration of the developing treatment apparatus according to the first embodiment.

As illustrated in FIG. 5, on an X-direction negative direction (lower direction in FIG. 5) side of the cup 122, a rail 30 is formed which extends along a Y-direction (right-left direction in FIG. 5). The rail 130 is formed, for example, from a Y-direction negative direction (left direction in FIG. 5) side outer position to a Y-direction positive direction (right direction in FIG. 5) side outer position of the cup 122. To the rail 130, for example, an arm 131 is attached.

On the arm 131, a developing solution discharge nozzle 132 as a discharger is supported. The developing solution discharge nozzle 132 discharges the developing solution as a treatment solution relating to the developing treatment. The arm 131 is movable on the rail 130 by a nozzle drive 133. This allows the developing solution discharge nozzle 132 to move from a waiting section 134 provided at a Y-direction negative direction side outer position of the cup 122 to above a central portion of the wafer W in the cup 122. Further, the arm 131 freely rises and lowers by the nozzle drive 133 to be able to adjust the height of the developing solution discharge nozzle 132. As the developing solution, butyl acetate is used.

As illustrated in FIG. 4, to the developing solution discharge nozzle 132, a supply pipe 135 is connected which supplies the developing solution to the developing solution discharge nozzle 132. The supply pipe 135 communicates with a developing solution supply source 136 which stores the developing solution therein. Further, the supply pipe 135 is provided with a supply equipment group (not illustrated) including a valve, a flow regulator and so on for controlling the flow of the developing solution.

At the top of the center in the housing 110, a filter 140 is provided for suppling clean air as clean gas into the housing 110. The clean air from a fan filter unit provided at a ceiling portion of the substrate treatment system 1 is further cleaned by the filter 140 and then supplied into the housing 110. Note that the developing treatment apparatus 30 is configured such that a downflow of the clean air passed through the filter 140 is formed.

Furthermore, the developing treatment apparatus 30 has a destaticizer 150 which supplies ions ionized by the soft X-ray to the developing solution discharged to the wafer W held on the spin chuck 120 to destaticize the developing solution.

Figure 6:
FIG. 6 is a view for explaining a reason why the developing treatment apparatus is provided with a destaticizer.

The reason why the developing treatment apparatus 30 is provided with the destaticizer 150 which destaticizes the developing solution discharged to the wafer W as above will be explained next using FIG. 6.

In the case of using butyl acetate as the developing solution as explained above, a center mode occurs in which many defects occur near the center of the wafer W after the completion of the developing treatment. A conceivable mechanism of the occurrence of the center mode is as follows.

Butyl acetate used as the developing solution is high in volume resistivity and therefore is electrostatically charged when it is supplied to the developing solution discharge nozzle 132 via the supply pipe 135 formed of an insulating material and is discharged from the developing solution discharge nozzle 132. As illustrated in FIG. 6(A), a developing solution L is electrostatically charged in a state of being located on the wafer W. Further, the wafer W on which the developing solution L is discharged also becomes electrostatically charged. Therefore, a repulsive force F due to electrostatic force between the wafer W and the developing solution L on the wafer W occurs in the developing solution. Then, the developing solution L in a film form on the wafer W is divided into small spherical liquid particles as illustrated in FIG. 6(B) so as to reduce the repulsive force F.

If the developing solution L is in a film form, the developing solution L is spun off from the top of the wafer W when the wafer W is rotated at a drying step of the wafer W being the final step in the developing treatment. However, if the developing solution L forms spherical liquid particles, the liquid particles of the developing solution L located at the center of the wafer W remain on the wafer W even when the wafer W is rotated because the centrifugal force applied to the liquid particles is small. Thus, if the liquid particles of the developing solution L contain foreign substances such as dust, the foreign substances remain as defects on the wafer W when the liquid particles are dried. Therefore, it is considered that the center mode occurs in the case of using butyl acetate as the developing solution.

Accordingly, if the developing solution applied on the wafer W is destaticized, the repulsive force due to the electrostatic force does not occur between the developing solution and the wafer W, so that the developing solution does not form into the spherical liquid particles on the wafer W but keeps the film form on the wafer W and is spun off from the wafer W at the drying step. Accordingly, it is considered that the occurrence of the center mode can be prevented.

Hence, the developing treatment apparatus 30 is provided with the above destaticizer 150.

The explanation will be returned to that of the developing treatment apparatus 30 itself.

The destaticizer 150 in the example in FIG. 4 has an X-ray radiator 151 between the filter 140 and the wafer W placed on the spin chuck 120 in the housing 110. The X-ray radiator 151 is to radiate a soft X-ray. The X-ray radiator 151 is concretely arranged at a position above the spin chuck 120 and overlapping in plan view with the wafer W held on the spin chuck 120. The X-ray radiator 151 radiates the soft X-ray to air between the filter 140 and the wafer W placed on the spin chuck 120 to ionize it. The ions ionized by the soft X-ray are supplied to the wafer W by the downflow of the clean air passed through the filter 140, and destaticize the developing solution applied on the wafer W.

Subsequently, the developing treatment in the developing treatment apparatus 30 will be explained using FIG. 6. FIG. 6 is a flowchart illustrating an example of the flow of the developing treatment. Note that, in the following explanation, it is assumed that, for example, a lower-layer film such as SoC (Spin on Carbon) or the like has been formed on the surface of the wafer W, a resist film has been formed on the lower-layer film, and the exposure processing and subsequent heat treatment of the resist film have been completed.

Prior to the developing treatment, for example, in a state where the X-ray is not radiated from the X-ray radiator 151, the transfer-in/out port 111 is brought into an open state by the opening and closing shutter 112, and the wafer W is transferred into the housing 110 and placed on the spin chuck 120. Thereafter, the transfer-in/out port 111 is brought into a closed state by the opening and closing shutter 112.

In the developing treatment, for example, the developing solution discharge nozzle 132 is first moved to above the central portion of the wafer W. Then, the developing solution is discharged from the developing solution discharge nozzle 132 onto the wafer W while the wafer W is being rotated, to form a developing solution puddle on the entire surface of the wafer W.

After the formation of the developing solution puddle, the supply of the developing solution from the developing solution discharge nozzle 132 is stopped and, for example, a stand development is performed by keeping the wafer W standing still for a predetermined time, thereby advancing the development of the resist film on the wafer W. During the above, the developing solution discharge nozzle 132 is retracted to the outside of the cup 122.

After the above predetermined time for advancing the development elapses and a resist a pattern is formed on the wafer W, the wafer W is rotated at high speed while ions for destaticization are being generated by radiating the X-ray from the X-ray radiator 151. The wafer W in this event is first rotated, for example, at 300 to 1000 rpm for 5 to 15 seconds, and then rotated at 1000 to 3000 rpm for 10 to 20 seconds. With this, the serial developing treatment is completed, and a resist pattern is formed on the wafer W.

Note that the ions are generated by the X-ray and supplied to the wafer W only at the drying step of the developing treatment, but the ion generation by the X-ray may be performed also during the developing solution discharge and during the stand development.

(Evaluation Test)

Figure 7:
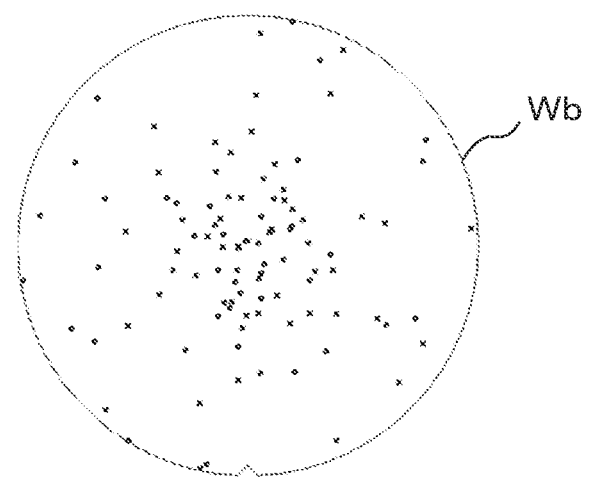
FIG. 7 is a view illustrating a distribution of defects on a bare wafer in an evaluation test and a distribution in a case where an X-ray is not radiated.
Figure 8:
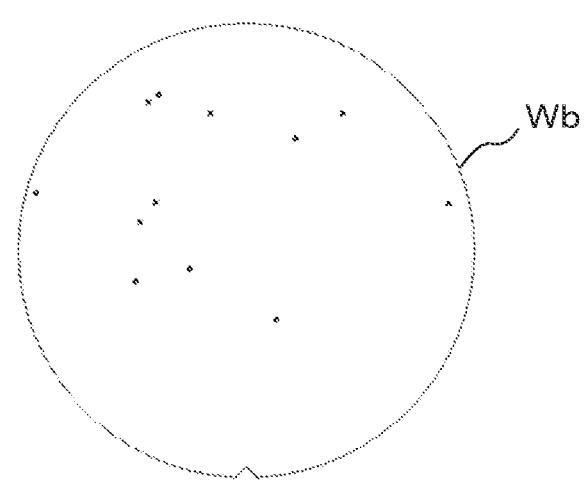
FIG. 8 is a view illustrating a distribution of defects on a bare wafer in an evaluation test and a distribution in a case where an X-ray is radiated.
Figure 9:
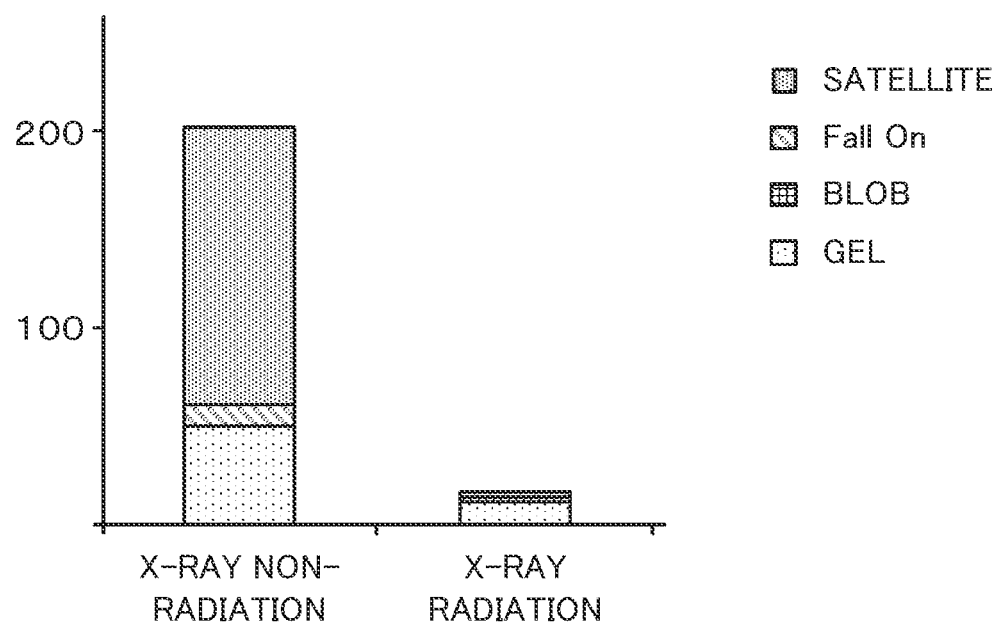
FIG. 9 is a chart illustrating the kinds and the numbers of defects on the bare wafers in the evaluation test.

The evaluation test about the provision of the destaticizer 150 was carried out using a bare wafer. FIG. 7 and FIG. 8 are views illustrating distributions of defects on bare wafers in the evaluation test. FIG. 9 is a chart illustrating the kinds and the numbers of the defects. FIG. 7 and FIG. 8 illustrate the numbers of the defects detected by a defect detection apparatus, and FIG. 9 illustrates the kinds and the numbers of the defects observed under a scanning electron microscope (SEM).

To both of the bare wafers, the developing solution was discharged in a state of holding them on the spin chuck 120, and thereafter they were dried by rotation. Further, in a case of radiating the X-ray from the X-ray radiator 151 (hereinafter, an X-ray radiation case), the X-ray was radiated for about 170 seconds from the start of discharge of the developing solution from the developing solution discharge nozzle 132 to the end of the drying step.

In the evaluation test, in a case of not radiating the X-ray from the X-ray radiator 151 (hereinafter, an X-ray non-radiation case), the number of defects was 100 to 150. In contrast to this, the number of defects was 10 to 35 in the above X-ray radiation case.

Further, in the X-ray non-radiation case, many defects occurred near the wafer center as illustrated in FIG. 7. In contrast to this, in the X-ray radiation case, few defects occurred near the wafer center as illustrated in FIG. 8.

Specifically, the provision of the X-ray radiator 151, in other words, the provision of the destaticizer 150 can suppress the occurrence of the center mode.

Note that as illustrated in FIG. 8, the number of defects at a wafer outer peripheral portion is also small in the X-ray radiation case. In short, the provision of the destaticizer 150 can decrease the number of defects on the entire wafer surface.

Further, in this embodiment, the ionization is performed by the X-ray, so that the generation of dust can be suppressed as compared with the case of ionization by a corona discharge method.

Further, as illustrated in FIG. 9, in the X-ray non-radiation case, there are a very large number of satellite defects which are observed in the case where the developing solution is not spun off during the drying step but remains as small spherical liquid particles on the wafer W. The satellite defect is such a defect that a small defect exists around a large defect. In contrast to this, in the X-ray radiation case, there are few satellite defects. More specifically, the provision of the destaticizer 150 can prevent the developing solution in small spherical liquid particles from remaining after the developing treatment and suppress the occurrence of the satellite defects.

Further, in the X-ray radiation case, the quantities of gel defects and Fall-on defects are also reduced as compared with that in the X-ray non-radiation case. The gel defect is a defect remaining in a gel form on the wafer W, and the Fall-on defect is a defect caused from the dust falling on the wafer W.

Effects of First Embodiment

According to this embodiment, since the ions ionized by the X-ray are supplied to the developing solution on the wafer W to destaticize the developing solution in the developing treatment, no repulsive force due to the electrostatic force occurs between the developing solution and the wafer W. Accordingly, the developing solution is not divided into small spherical liquid particles on the wafer W, so that the developing solution never remains both at the outer peripheral portion and the central portion on the surface of the wafer W at the drying step in the developing treatment. Therefore, the occurrence of the center mode can be suppressed.

Second Embodiment

Figure 10:
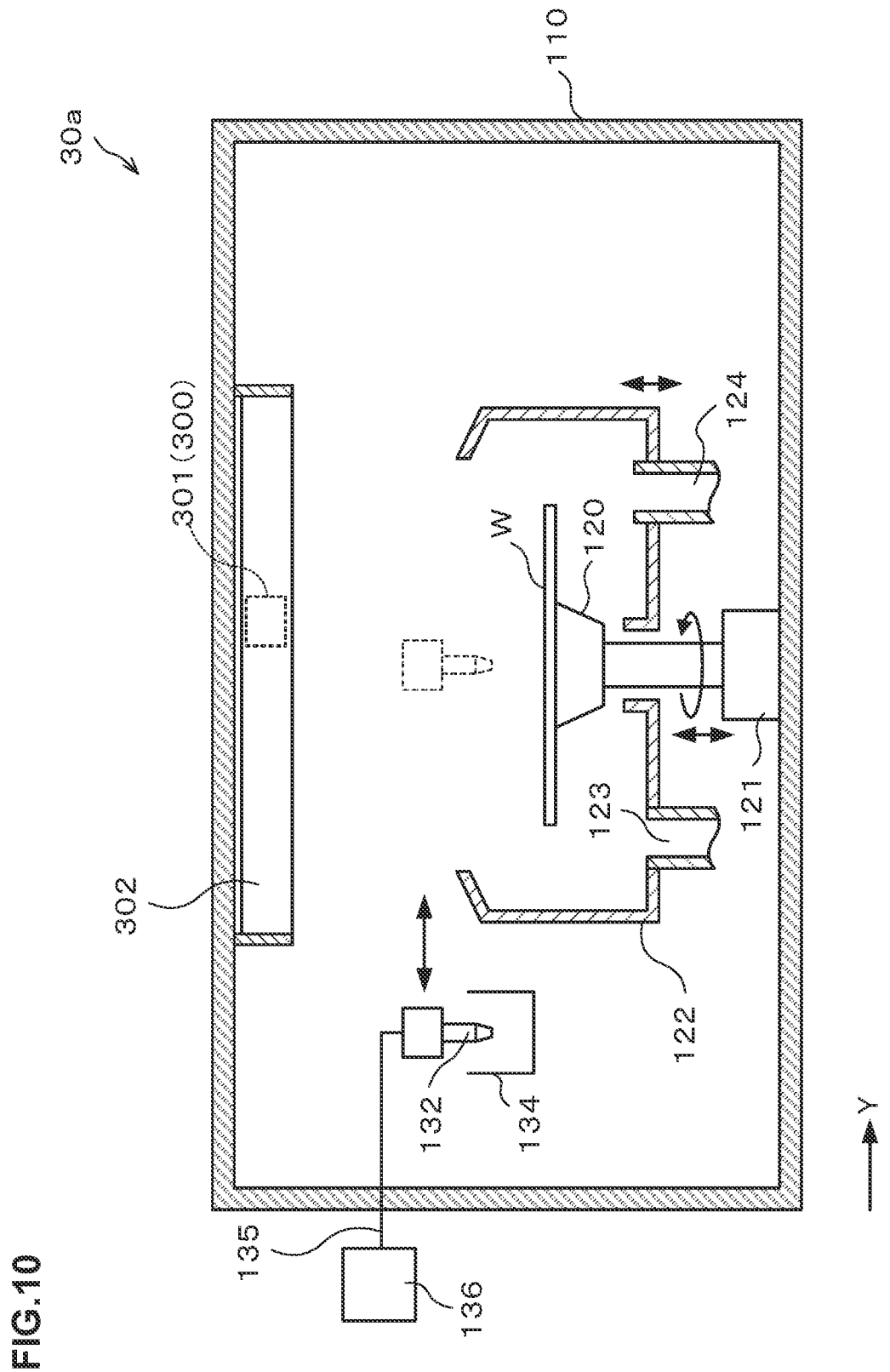
FIG. 10 is a transverse sectional view illustrating the outline of a developing treatment according to a second embodiment.

FIG. 10 is a transverse sectional view illustrating the outline of a developing treatment apparatus 30a according to a second embodiment.

In the developing treatment apparatus 30 in the first embodiment, the destaticizer 150 has the X-ray radiator 151 between the filter 140 and the wafer W placed on the spin chuck 120 in the housing 110.

In contrast to the above, in the developing treatment apparatus 30a in this embodiment, a destaticizer 300 has, in a filter 302, an X-ray radiator 301 which radiates a soft X-ray, and the filter 302 is formed of a material transmitting the soft X-ray. The filter 302 is, for example, a ULPA filter.

Also in this embodiment, the developing solution applied on the wafer W is destaticized by the destaticizer 300, so that when the wafer W is dried by rotation, the developing solution is spun off from the wafer W and does not remain at the center of the wafer W, thus making it possible to suppress the occurrence of the center mode.

Further, when using the developing treatment apparatus 30 in the first embodiment, the soft X-ray from the X-ray radiator 151 is applied to the wafer W. The soft X-ray directly radiated to the wafer W in this manner may influence the line width of the resist film, the film thickness of the lower anti-reflection film (for example, an SoC film), or the like. The intensity of the soft X-ray attenuates according to the distance from an emission source.

In this embodiment, the X-ray radiator 301 is provided in the filter 302, so that the distance from the X-ray radiator 301 to the wafer W is large. Accordingly, the amount of the soft X-ray radiated to the wafer W is suppressed, so that it is possible to prevent the soft X-ray from influencing the wafer W.

Third Embodiment

Figure 11:
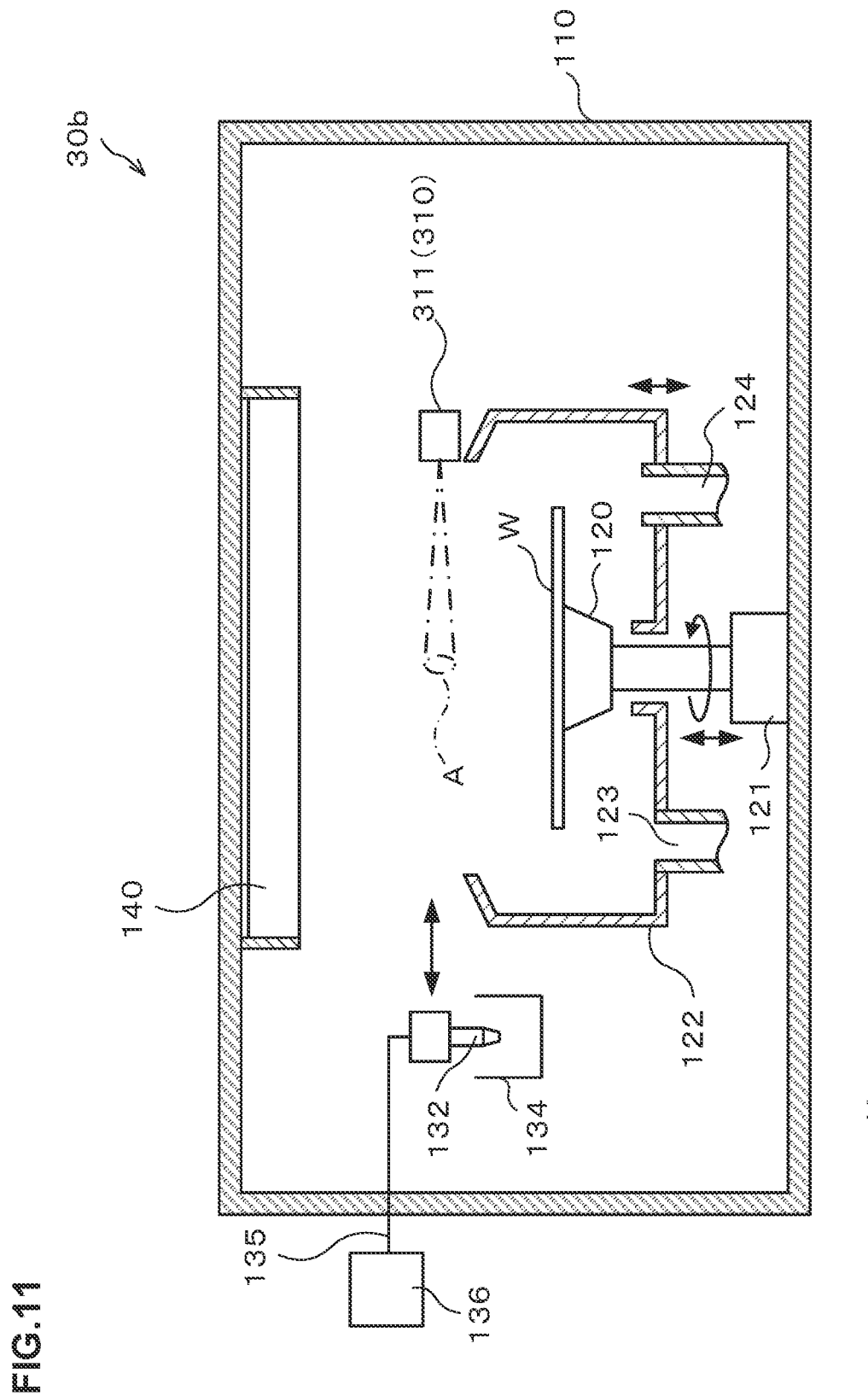
FIG. 11 is a transverse sectional view illustrating the outline of a developing treatment according to a third embodiment.

FIG. 11 is a transverse sectional view illustrating the outline of a developing treatment apparatus 30b according to a third embodiment.

In the case of using of the developing treatment apparatus 30 in the first embodiment, the soft X-ray from the X-ray radiator 151 is radiated to the wafer W as explained above. The soft X-ray radiated to the wafer W in this manner may influence the wafer W.

Hence, in the developing treatment apparatus 30b in the third embodiment, an X-ray radiator 311 included in a destaticizer 310 is arranged at a position where the wafer W held on the spin chuck 120 is not included in a radiation range A of the X-ray from the X-ray radiator 311. More specifically, the X-ray radiator 311 is arranged, for example, at a position not overlapping in plan view with the wafer W held on the spin chuck 120, and is provided so that the optical axis of the X-ray radiator 311 is parallel to the surface of the wafer W.

Note that in order to efficiently supply the wafer W with the ions generated by the X-ray from the X-ray radiator 311, the X-ray radiator 311 is preferably provided at a position close to the spin chuck 120 and provided, for example, near the upper end of the cup 122.

Also in this embodiment, air above the wafer W held on the spin chuck 120 is ionized by the X-ray, and the ions can be supplied to the developing solution on the wafer W by the downflow of the clean air passed through the filter 140. Therefore, the developing solution on the wafer W can be destaticized, so that when the wafer W is dried by rotation, the developing solution is spun off from the wafer W and never remains at the center of the surface of the wafer W, thus making it possible to suppress the occurrence of the center mode.

Fourth Embodiment

Figure 12:
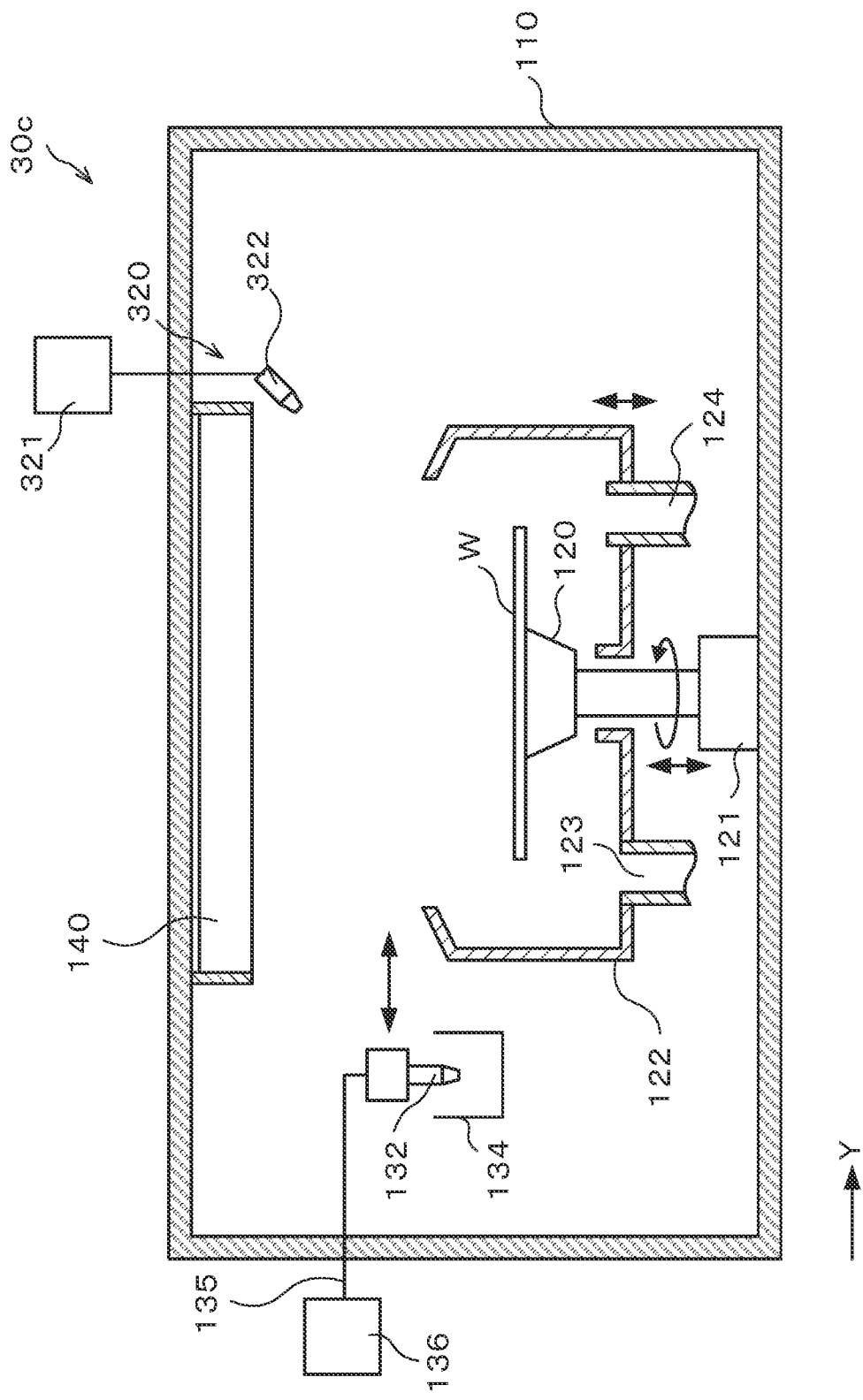
FIG. 12 is a transverse sectional view illustrating the outline of a developing treatment according to a fourth embodiment.

FIG. 12 is a transverse sectional view illustrating the outline of a developing treatment apparatus 30c according to a fourth embodiment.

In the developing treatment apparatus 30 in the first embodiment or the like, the destaticizer 150 supplies the ions ionized by the X-ray in the housing 110 to the wafer W held on the spin chuck 120.

In the developing treatment apparatus 30c in the fourth embodiment, as illustrated in FIG. 12, a destaticizer 320 has an ion discharge nozzle 322 as an ion discharger which discharges ions ionized by the X-ray in an ion supply source 321 located outside the apparatus 30c into the housing 110. The ion discharge nozzle 322 is provided at an upper portion in the housing 110 so as to discharge ions between the filter 140 and the wafer W held on the spin chuck 120. The position of the ion discharge nozzle 322 may be another position as long as the ions can be supplied to the wafer W held on the spin chuck 120.

Also in this embodiment, the developing solution applied on the wafer W is destaticized by the destaticizer 320, so that when the wafer W is dried by rotation, the developing solution is spun off from the wafer W and never remains at the center of the wafer W, thus making it possible to suppress the occurrence of the center mode.

In the above examples, the developing treatment apparatuses according to the first to fourth embodiments supply a negative developing solution such as butyl acetate as the developing solution, but may supply another negative developing solution or a positive developing solution having a volume resistivity of $3.4 \times 10^{11}$ Ωcm or more. These developing solutions may cause the center mode because of a high volume resistivity, but the occurrence of the center mode can be suppressed by destaticizing the developing solution discharged on the wafer by the destaticizer.

Besides, the developing solution discharged on the wafer is destaticized in the above examples, but in the case of using a rinse solution in the developing treatment, the rinse solution applied on the wafer may be destaticized. In the case of using a positive developing solution, DIW is used as the rinse solution in some cases. The DIW (Deionized Water) as the rinse solution is electrostatically charged by the friction with the wafer in some cases when the wafer is dried by rotation after the discharge of DIW. The DIW discharged on the wafer held on the spin chuck and electrostatically charged is destaticized by the destaticizer, whereby the DIW never forms into spherical liquid particles by the repulsive force due to the electrostatic force. Accordingly, when drying the wafer W by rotation, the DIW is spun off and never remains on the wafer, so that the occurrence of the center mode can be suppressed.

For the same reason, also in the case of using DIW or pure water as the developing solution, the developing solution discharged on the wafer held on the spin chuck is destaticized by the destaticizer, whereby the occurrence of the center mode can be suppressed.

The embodiments disclosed herein are examples in all respects and should not be considered to be restrictive. The above embodiments may be abbreviated, replaced, or changed in various forms without departing from the scope and spirit of the attached claims.

Note that the following configurations also belong to the technical scope of this disclosure.

(1) A developing treatment apparatus for discharging a developing solution to a treatment object substrate to perform a developing treatment on the treatment object substrate, the developing treatment apparatus includes:

a rotating and holding part configured to hold and rotate the treatment object substrate;

a discharger configured to discharge the developing solution to the treatment object substrate held on the rotating and holding part; and a destaticizer configured to supply ions ionized by an X-ray to the developing solution discharged to the treatment object substrate held on the rotating and holding part, to destaticize the developing solution.

In the above (1), since the ions ionized by the X-ray are supplied to a predetermined solution such as the developing solution discharged to the treatment object substrate held on the rotating and holding part, to destaticize the predetermined solution, the repulsive force due to the electrostatic force does not occur between the predetermined solution and the treatment object substrate. Accordingly, the predetermined solution is not divided into small spherical shapes on the treatment object substrate, so that when the treatment object substrate on which the predetermined solution has been discharged is dried by rotation, the predetermined solution never remains on the treatment object substrate. Therefore, many defects never occur near the center of the treatment object substrate.

(2) The developing treatment apparatus according to the (1), wherein the predetermined solution is a developing solution having a volume resistivity of $3.4 \times 10^{11}$ Ωcm or more.

(3) The developing treatment apparatus according to the (1) or (2), wherein:

the destaticizer includes an X-ray radiator configured to radiate the X-ray; and the X-ray radiator is arranged at a position above the rotating and holding part and overlapping in plan view with the treatment object substrate held on the rotating and holding part.

(4) The developing treatment apparatus according to the (1) or (2) wherein:

the destaticizer includes an X-ray radiator configured to radiate the X-ray;

the developing treatment apparatus includes:

a housing configured to house the rotating and holding part and the discharger; and a filter configured to supply clean gas into the housing; and the X-ray radiator is arranged in the filter.

(5) The developing treatment apparatus according to claim the (1) or (2), wherein:

the destaticizer includes an X-ray radiator configured to radiate the X-ray; and the X-ray radiator is arranged at a position where the treatment object substrate held on the rotating and holding part is not included in a radiation range of the X-ray from the X-ray radiator.

(6) The developing treatment apparatus according to the (1) or (2), further including a housing configured to house the rotating and holding part and the discharger, wherein the destaticizer includes an ion discharger configured to discharge ions ionized in an ion supply source located outside the developing treatment apparatus, into the housing.

(7) A developing treatment method of performing a developing treatment on a treatment object substrate, the developing treatment method including the steps of:

discharging a predetermined solution relating to the developing treatment to the treatment object substrate;

drying the treatment object substrate to which the predetermined solution has been discharged, by rotating the treatment object substrate; and supplying ions ionized by an X-ray to the predetermined solution discharged to the treatment object substrate, to destaticize the predetermined solution.

EXPLANATION OF CODES 30, 30a to 30c developing treatment apparatus
120 spin chuck
132 developing solution discharge nozzle
150, 300, 310, 320 destaticizer
W wafer

What is claimed is:

1. A developing treatment apparatus for performing a developing treatment on a treatment object substrate, the developing treatment apparatus comprising:

a rotating and holding part configured to hold and rotate the treatment object substrate;

a discharger configured to discharge a predetermined solution relating to the developing treatment to the treatment object substrate held on the rotating and holding part; and a destaticizer configured to supply ions ionized by an X-ray to the predetermined solution discharged to the treatment object substrate held on the rotating and holding part, to destaticize the predetermined solution, wherein the predetermined solution is a developing solution having a volume resistivity of $3.4 \times 10^{11}$ Ωcm or more.

2. The developing treatment apparatus according to claim 1, wherein:

the destaticizer comprises an X-ray radiator configured to radiate the X-ray; and the X-ray radiator is arranged at a position above the rotating and holding part and overlapping in plan view with the treatment object substrate held on the rotating and holding part.

3. The developing treatment apparatus according to claim 1, wherein:

the destaticizer comprises an X-ray radiator configured to radiate the X-ray;

the developing treatment apparatus comprises:

a housing configured to house the rotating and holding part and the discharger; and a filter configured to supply clean gas into the housing; and the X-ray radiator is arranged in the filter.

4. The developing treatment apparatus according to claim 1, wherein:

the destaticizer comprises an X-ray radiator configured to radiate the X-ray; and the X-ray radiator is arranged at a position where the treatment object substrate held on the rotating and holding part is not included in a radiation range of the X-ray from the X-ray radiator.

5. The developing treatment apparatus according to claim 1, further comprising a housing configured to house the rotating and holding part and the discharger, wherein the destaticizer comprises an ion discharger configured to discharge ions ionized in an ion supply source located outside the developing treatment apparatus, into the housing.

6. A developing treatment method of performing a developing treatment on a treatment object substrate, the developing treatment method comprising the steps of:

discharging a predetermined solution relating to the developing treatment to the treatment object substrate;

drying the treatment object substrate to which the predetermined solution has been discharged, by rotating the treatment object substrate; and supplying ions ionized by an X-ray to the predetermined solution discharged to the treatment object substrate, to destaticize the predetermined solution, wherein the predetermined solution is a developing solution having a volume resistivity of $3.4 \times 10^{11}$ Ωcm or more.

7. A developing treatment apparatus for performing a developing treatment on a treatment object substrate, the developing treatment apparatus comprising:

a rotating and holding part configured to hold and rotate the treatment object substrate;

a discharger configured to discharge a predetermined solution relating to the developing treatment to the treatment object substrate held on the rotating and holding part; and a destaticizer configured to supply ions ionized by an X-ray to the predetermined solution discharged to the treatment object substrate held on the rotating and holding part, to destaticize the predetermined solution, wherein:

the destaticizer comprises an X-ray radiator configured to radiate the X-ray; and the X-ray radiator is arranged at a position above the rotating and holding part and overlapping in plan view with the treatment object substrate held on the rotating and holding part.

8. A developing treatment apparatus for performing a developing treatment on a treatment object substrate, the developing treatment apparatus comprising:

a rotating and holding part configured to hold and rotate the treatment object substrate;

a discharger configured to discharge a predetermined solution relating to the developing treatment to the treatment object substrate held on the rotating and holding part; and a destaticizer configured to supply ions ionized by an X-ray to the predetermined solution discharged to the treatment object substrate held on the rotating and holding part, to destaticize the predetermined solution, wherein:

the destaticizer comprises an X-ray radiator configured to radiate the X-ray;

the developing treatment apparatus comprises:

a housing configured to house the rotating and holding part and the discharger; and a filter configured to supply clean gas into the housing; and the X-ray radiator is arranged in the filter.

9. A developing treatment apparatus for performing a developing treatment on a treatment object substrate, the developing treatment apparatus comprising:

a rotating and holding part configured to hold and rotate the treatment object substrate;

a discharger configured to discharge a predetermined solution relating to the developing treatment to the treatment object substrate held on the rotating and holding part; and a destaticizer configured to supply ions ionized by an X-ray to the predetermined solution discharged to the treatment object substrate held on the rotating and holding part, to destaticize the predetermined solution, wherein:

the destaticizer comprises an X-ray radiator configured to radiate the X-ray; and the X-ray radiator is arranged at a position where the treatment object substrate held on the rotating and holding part is not included in a radiation range of the X-ray from the X-ray radiator.

\* \* \* \* \*